United States Patent
Milton

(10) Patent No.: US 7,591,383 B1
(45) Date of Patent: Sep. 22, 2009

(54) RACK MOUNTABLE DISPLAY APPARATUS

(75) Inventor: Cynthia Mary Milton, Thatcham (GB)

(73) Assignee: Sun Microsystems, Inc., Santa Clara, CA (US)

( * ) Notice: Subject to any disclaimer, the term of this patent is extended or adjusted under 35 U.S.C. 154(b) by 2064 days.

(21) Appl. No.: 09/621,934

(22) Filed: Jul. 24, 2000

(30) Foreign Application Priority Data

Apr. 7, 2000 (GB) ................................ 0008722.1

(51) Int. Cl.
*A47F 5/00* (2006.01)
(52) U.S. Cl. .................. 211/26; 211/94.01; 312/223.2; 361/683
(58) Field of Classification Search ............ 211/26, 211/94.01, 43; 361/683; 312/223.2
See application file for complete search history.

(56) References Cited

U.S. PATENT DOCUMENTS

| | | | | |
|---|---|---|---|---|
| 5,281,018 A | * | 1/1994 | Cullinan | ................. 312/223.2 |
| 5,388,032 A | | 2/1995 | Gill et al. | |
| 5,424,912 A | | 6/1995 | Mikan | |
| 5,553,824 A | * | 9/1996 | Dutra | ...................... 211/43 X |
| 5,959,275 A | | 9/1999 | Hughes et al. | |
| 6,061,966 A | * | 5/2000 | Nelson et al. | |
| 6,142,590 A | * | 11/2000 | Harwell | .................... 312/223.1 |
| 6,185,092 B1 | * | 2/2001 | Landrum et al. | ............ 361/683 |
| 6,283,429 B1 | * | 9/2001 | Markovich et al. | ...... 361/683 X |

FOREIGN PATENT DOCUMENTS

GB    2 245 801    1/1992

OTHER PUBLICATIONS

Combined Search & Examination Report, Application No. GB 0008722.1, mailed Oct. 19, 2000.

* cited by examiner

*Primary Examiner*—Robert W. Gibson, Jr.
(74) *Attorney, Agent, or Firm*—Meyertons Hood Kivlin Kowert & Goetzel, P.C.; B. Noël Kivlin

(57) ABSTRACT

Rack mountable display apparatus is provided for an electronic equipment rack. The apparatus includes a support for the display whereby the display is moveable between a storage position within the rack and a deployed position external to the rack. The display can be in the form of sheets of material supported on a mount, or could be in the form of an electronic display in combination with a processor. The processor could be located within the rack, or could be deployed with the display, for example where the display is part of a portable computer. The display is used to provide maintenance information to a maintenance engineer to facilitate maintenance of the rack mounted equipment.

32 Claims, 8 Drawing Sheets

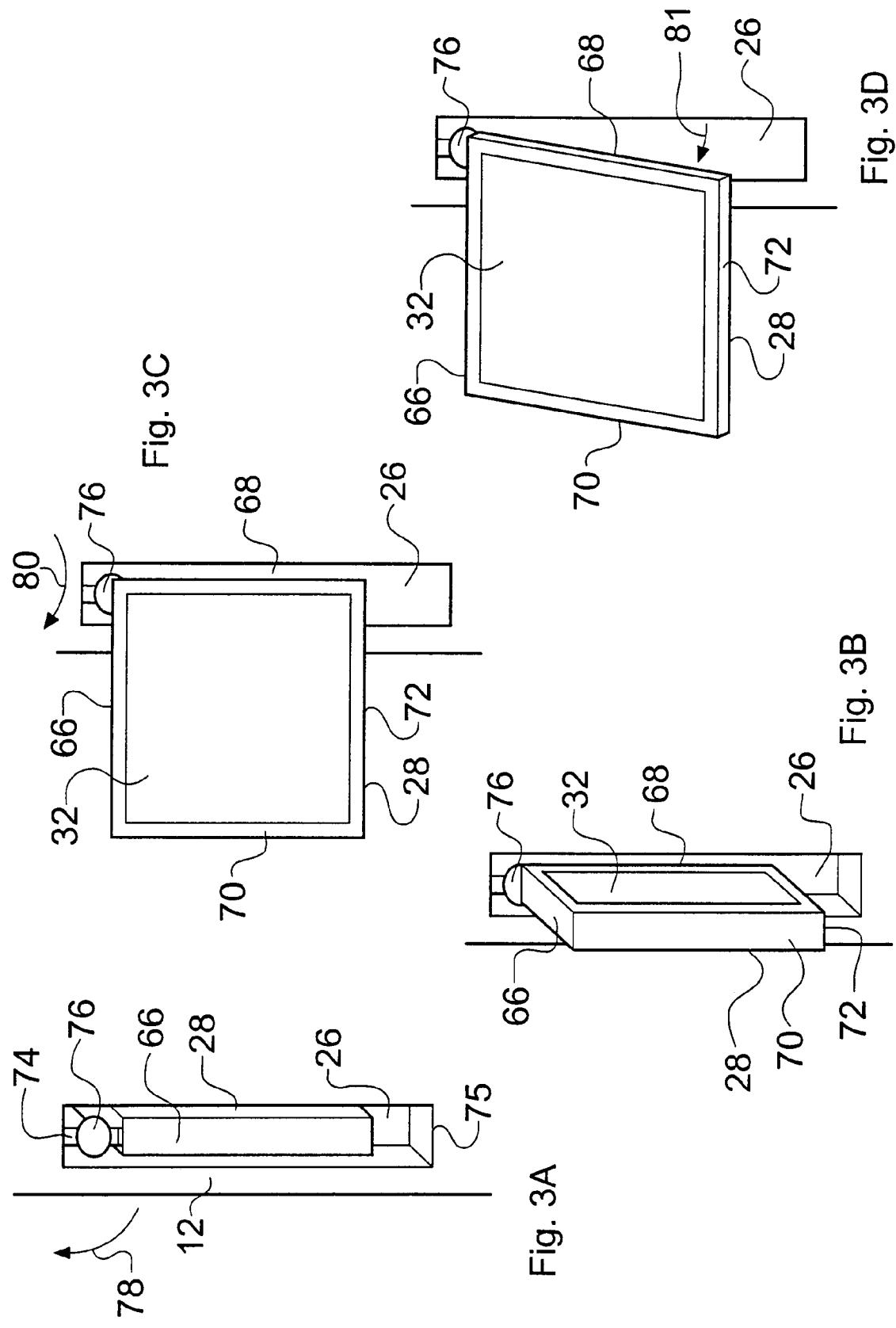

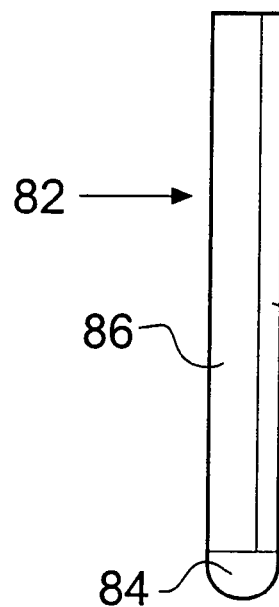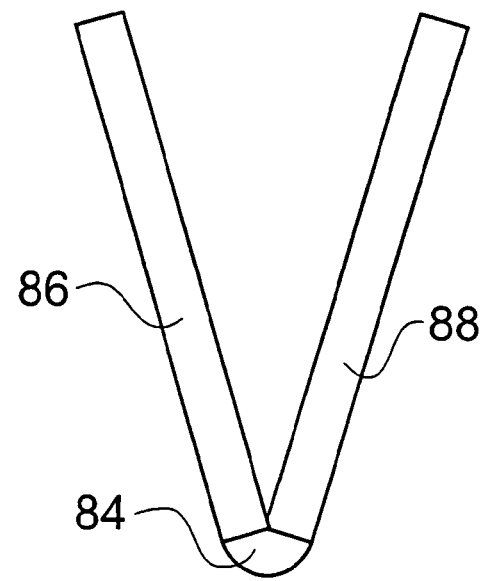
Fig. 4A    Fig. 4B
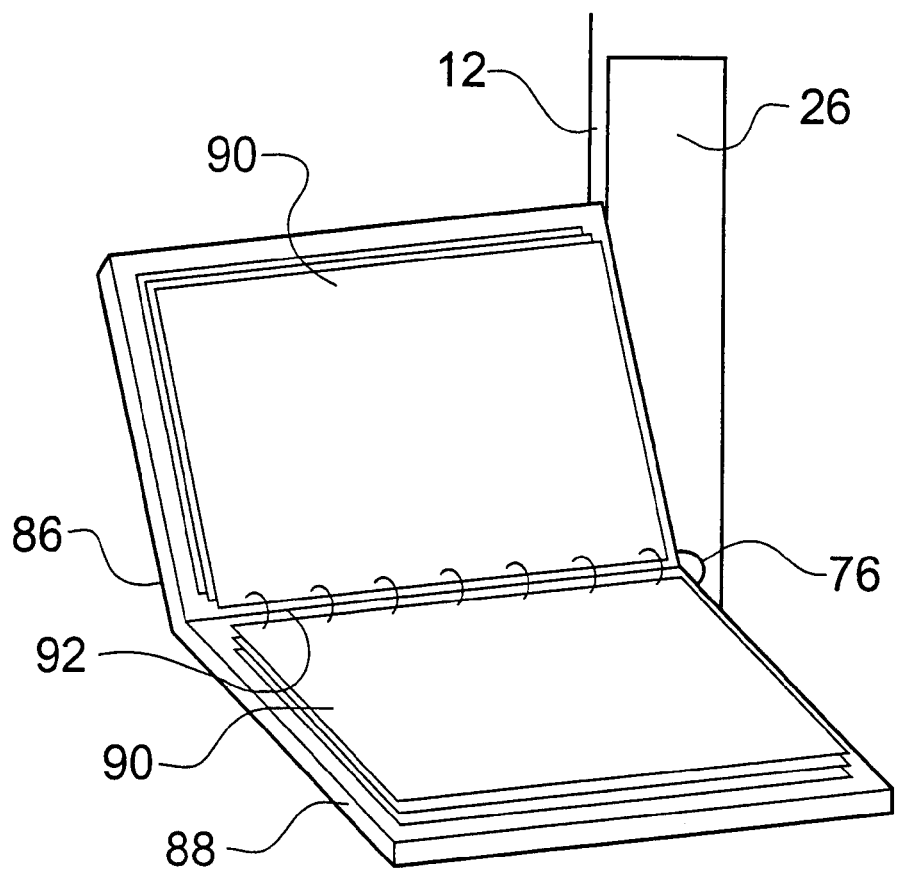
Fig. 4C

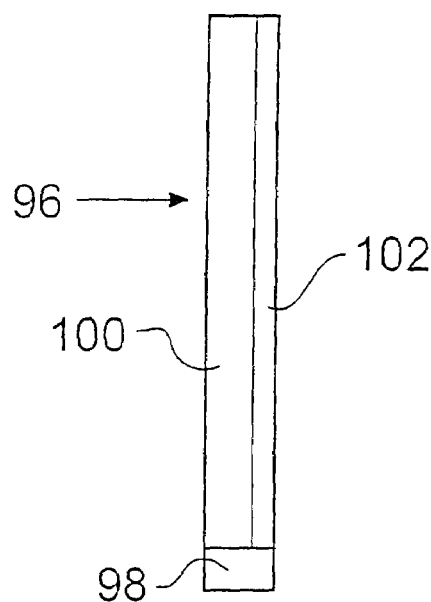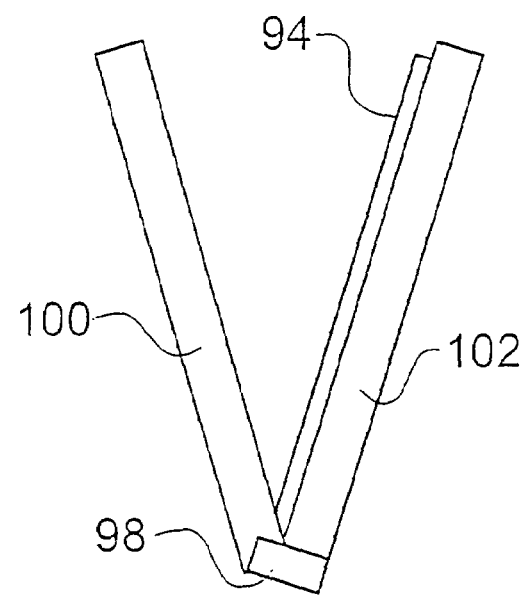
Fig. 5A     Fig. 5B
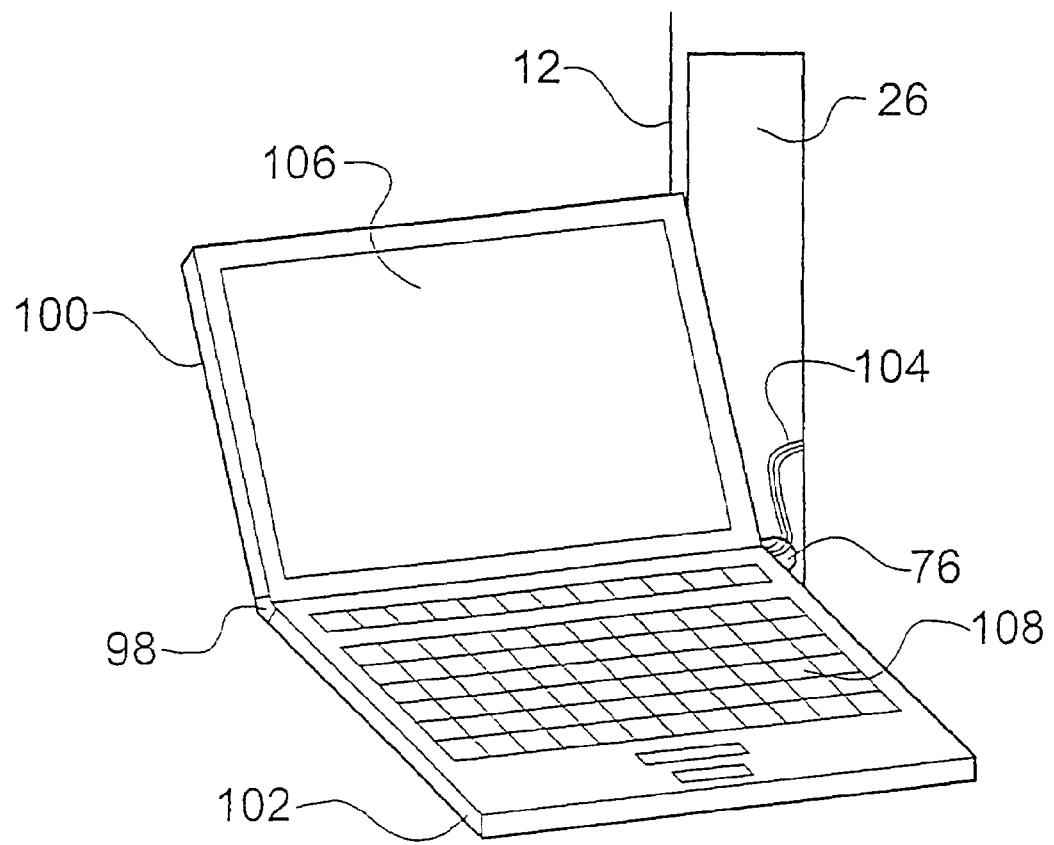
Fig. 5C

RACK MOUNTABLE DISPLAY APPARATUS

BACKGROUND OF THE INVENTION

This invention relates to equipment racks, and in particular to display apparatus for such a rack.

Equipment racks provide a standard way of arranging various components to form a system. In such a rack, an external frame supports slotted bars, to which are attached individual system components. An application for such a rack system is in the computer and telecommunications fields. In a particular example, rack mountable equipment can comprise components of a fault tolerant computer system. Such fault tolerant computer systems are used, for example, to implement switches and other data nodes within a telecommunication system. As a result of the nature of such equipment, it is often situated at a remote location, and needs to be serviced by visiting service personnel. Such equipment is complex, and the maintenance operations to be performed can also be complex. As there are many different configurations of equipment, and many different maintenance operations that might need to be performed, the service engineer needs to carry round a significant quantity of manuals and other documentation to facilitate maintenance of the equipment. It would be desirable to leave suitable maintenance information with the rack-mounted equipment. However, given that the rack-mounted equipment may be at a remote, unsupervised location, and also that it may be in an environment where limited space is available, storage of such materials can be a problem.

Accordingly, the present invention seeks to address this problem.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

In accordance with an aspect of the invention, there is provided rack mountable display apparatus for an electronic equipment rack. The apparatus includes a support mechanism for a display. The display is moveable between a storage position within the rack and a deployed position external to the rack.

By providing a display that can be stored in the rack and then be deployed into an operative, deployed position, a display for displaying information to support personnel can be stored out of the way in the rack and can then be deployed when it is needed. This is space efficient and avoids the need for the maintenance personnel to carry around maintenance instructions for all types of rack mountable equipment that they might encounter.

In one embodiment the display is slideable between the storage position with the display stored within the rack and the deployed position with the display deployed externally to the rack. In another embodiment the display is pivotable between the storage position with the display stored within the rack and the deployed position with the display deployed externally to the rack.

The support mechanism can also provide for orientation of the display in the deployed position to facilitate reading of the display. This could be achieved by one or more pivot arrangements, for example, to enable the display to be swung away from the rack and/or to be held at a desired orientation to the vertical to facilitate the reading of information therefrom by support personnel.

In one embodiment, a universal joint could be provided to enable pivoting of the display between the storage position and the deployed position and further to enable orientation of the display to facilitate reading of the display.

In preferred embodiments of the invention, the thickness of the display is less than the height and width of the display. This enables to the display to be held, when in the storage position, substantially vertically. This minimises the impact of the display on the flow of cooling air through the rack, the flow of cooling air being normally configured to be from bottom to the top of the rack. If the display in the storage position is also arranged to minimise the frontal area, when viewing the rack from the front, this means that the display occupies a minimum frontal area, maximising the space available for the operative electronic components in the rack.

In one simple embodiment, the display is formed by a plurality of sheets of material, for example sheets of plasticised card, that are held together on a carrier (for example by rings passing though holes in the sheets of display material) on the display support. Service personnel can leaf through the sheets to find the maintenance information needed to carry out appropriate maintenance operations.

In another embodiment, the display comprises a display screen. This enables more comprehensive information to be supplied to the support personnel, for example in the form of an interactive set of instructions and information.

Preferably a flat panel display, for example an LCD display is used to minimise the storage space needed for the display when in both the storage and the deployed positions.

By providing a touch panel display, the display can be used for the input of information, avoiding the necessity for a separate keyboard or other input device.

By connecting the display to a processor, the control of the interactive display of instructions and information can be controlled by program code.

The processor could be retained within the rack when the display is deployed, the processor being connected to the display. Alternatively, the processor could be deployed with the display. Indeed, in one embodiment of the invention the display and the processor form parts of a portable computer. Whether or not a touch sensitive screen is provided, a keyboard and/or other conventional user input devices can be provided.

An electronic equipment rack can be configured to provide a plurality of locations for receiving electronic equipment components and also a location for receiving the display apparatus as set out above.

The location for the display apparatus is preferably arranged in the rack such that the display is located in a substantially vertical orientation extending back into the rack from a front surface thereof when in the storage position within the rack. This can minimise the impact on airflow through the rack and minimise the frontal area of the rack occupied by the display when mounted in the rack.

In a preferred embodiment the display location is adjacent one side of the rack so that it can be deployed to extend beyond one side of the rack when in the deployed position, thereby not to inhibit access to rack mountable component.

Where the display is connected to a processor, the processor is preferably connected to at least one of the electronic system components in the rack for receiving status information. Program code is then arranged to control the processor to cause the display of an interactive sequence of instructions to service personnel for maintaining the electronic rack equipment, with the program code responsive to the status information for controlling the interactive sequence of instructions.

In accordance with another aspect of the invention, there is provided a method of providing maintenance information to personnel for maintaining electronic equipment mounted in a rack. The method comprises providing a support mechanism for a display, the display being moveable between a storage position within the rack and a deployed position external to the rack. The method can further comprise providing maintenance information to the support personnel when the display is located in the deployed position.

BRIEF DESCRIPTION OF THE DRAWINGS

Exemplary embodiments of the present invention will be described hereinafter, by way of example only, with reference to the accompanying drawings in which like reference signs relate to like elements and in which:

FIGS. 3A-3D are schematic front views representing the deployment of a pivotally mounted display;

FIGS. 4A-4C represent the opening of a display based on sheets of display material;

FIGS. 5A-5C represent the opening of a display forming part of a portable computer;

DESCRIPTION OF THE PARTICULAR EMBODIMENTS

In the following, particular embodiments of the invention will be described by way of example only.

Figure 1:
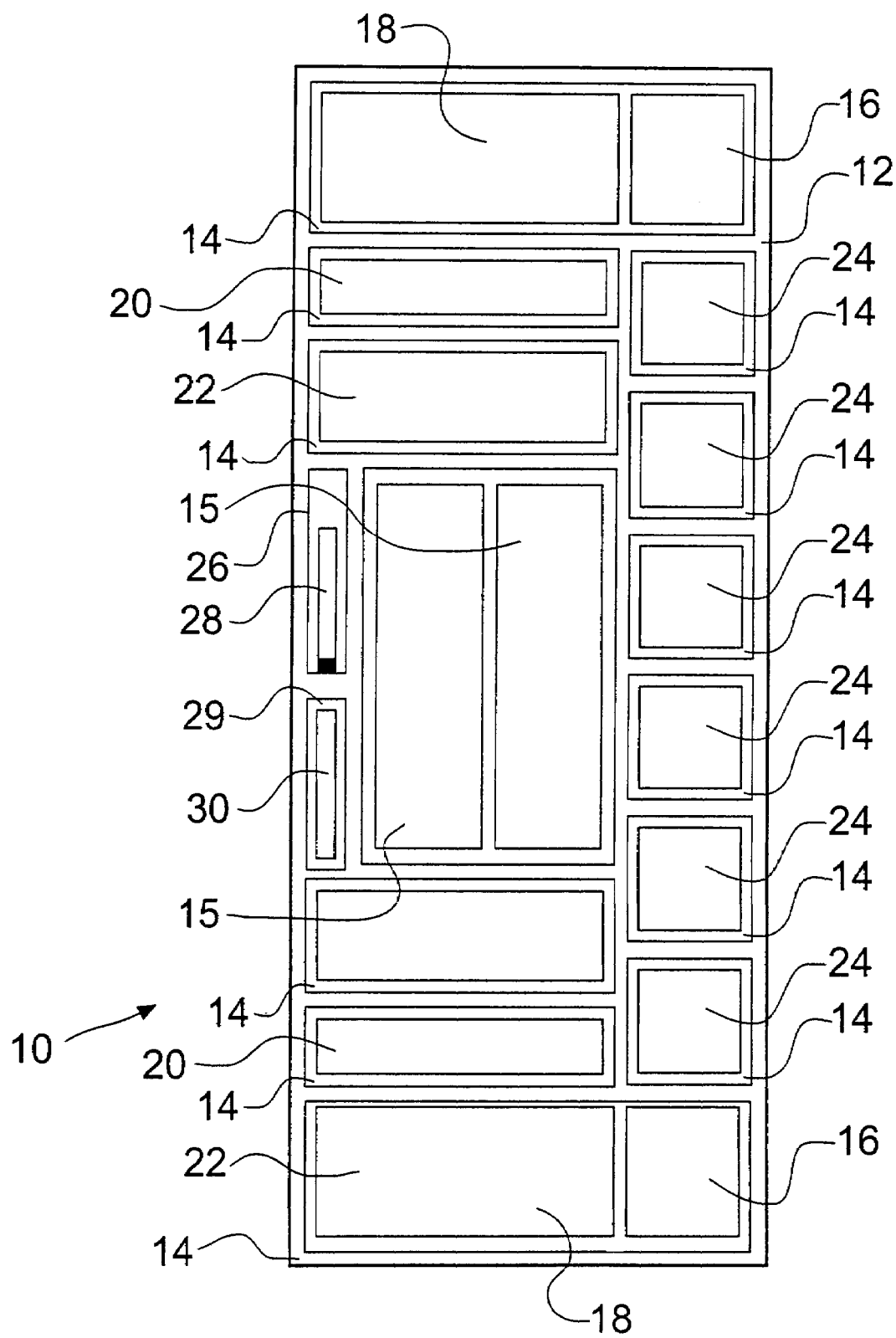
FIG. 1 is a schematic overview of the front of a rack containing rack mountable equipment.

FIG. 1 is a schematic front view of an equipment rack 10 that includes a chassis, or frame, 12 defining a plurality of locations, or areas, 14 for receiving various components of an electronic system. In the present example, the components form part of a fault tolerant multiprocessor computing system for a telecommunications apparatus.

Examples of the components forming part of the fault tolerant computer system at the various locations 14 are processor modules 15, removable media modules 16 for tapes, removable disks, etc., fixed disk drives 18, console and fan units 20 that include switches, ports, alarms and LEDs (Light Emitting Diodes), etc., PCI (Peripheral Component Interface) cards 22 and power supply units 24.

Also provided within this embodiment of a racking system in accordance with the invention is a first specific location, or slot, 26 for receiving a retractable display 28. Optionally, a second specific location, or slot, 29 can be provided for a maintenance processor 30 that is connected by power and signal connections to the display 28.

The retractable display is arranged to be retained in a retracted, or storage position in the slot 26 within the rack 10 and to be moved to deployed and operative positions outside to the front of the rack 10.

When in the storage position, the display 28 is oriented in a substantially vertical orientation extending back into the rack 10 from the front thereof. This arrangement minimises the impact on the cooling airflow through the rack (which is arranged to be from bottom to top) and to minimise the frontal area of the rack 10 occupied by the display when stored in the rack 10.

As will be described later, when in the operative position, the display is preferably located at and extending beyond one side of the front surface of the rack 10. This serves to avoid the positioning of the display inhibiting access to other components mounted in the rack 10.

FIGS. 2A-2D represent plan views, through the rack, of one example of a support arrangement for enabling the deployment of a display 28 from the storage to a n operative, deployed, position. In this example, the support arrangement includes a slideably mounted carriage carrying the display 28.

Figure 2A:
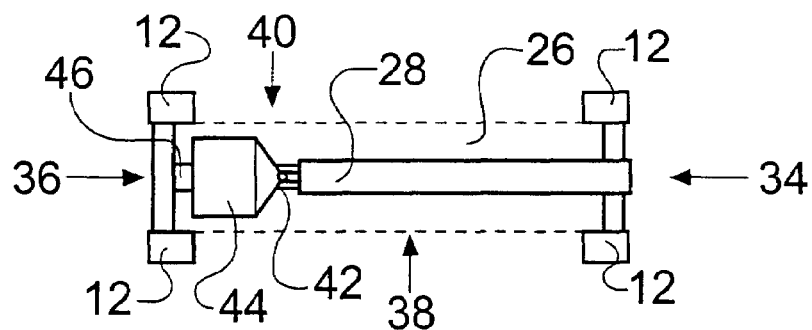
FIGS. 2A-2D are schematic plan views illustrating the deployment of a slideably mounted display and FIG. 2E is a further schematic illustration of details of the support for a slideably mounted display.

FIG. 2A represents a storage position of the display 28 within the slot 26. As illustrated in FIG. 2A, the front 34 of the slot 26 corresponds to the front of the equipment rack 10. The rear 36 of the slot 26 corresponds to the rear of the equipment rack 10. A first side 38 of the slot 26 is located adjacent the frame 12 at the left-hand side of the frame 12 as viewed in FIG. 1. A second side 40 of the slot 26 forms a partition between the slot 26 and an adjacent component. It should be noted that the slot may include side walls are represented by the dashed lines, or it may be open between the uprights of the frame 12. Accordingly, where reference is made to a slot herein, it should be noted that this does not mean that reference is made necessarily to a structure with external walls, but that it may relate to an open structure defined by uprights and cross members of an open frame. The display 28 is supported by hinges 42 to a carriage 44, which, as will be described below, runs on a slide 46.

Figure 2B:
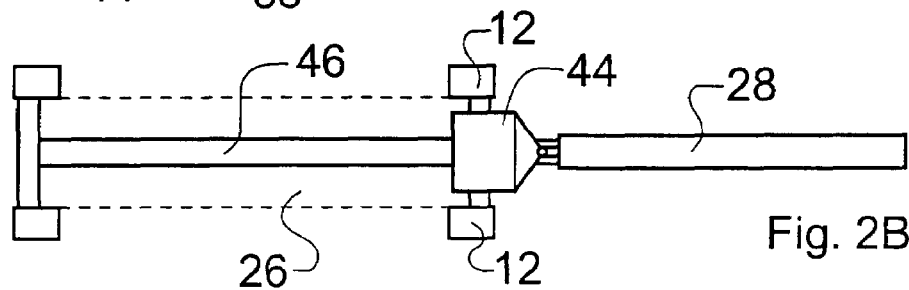

FIG. 2B illustrates a first deployed position of the display 28, in which the display is moved forward to the exterior of the slot 26. As mentioned above, the display 28 is mounted on a carriage 44, which runs on a slide 46. The inter-engagement of the slide 46 and the carriage 44 can be achieved in any desired manner. For example, the slide 46 could be formed with a rail at the top and bottom, respectively, of the slot 26, with the carriage 44 being formed with runners for running on each of the rails at the top and bottom of the slot 26. Alternatively, the slide 46 could be configured as a elongate plate, for example only at the bottom of the slot 26, with a lower end of the carriage 44 being formed with left and right "U" shaped runners for engaging about either side of the plate. The runners could include a sliding bearing using a low friction plastics material such as nylon or PTFE (polytetrafluroethylene).

Figure 2C:
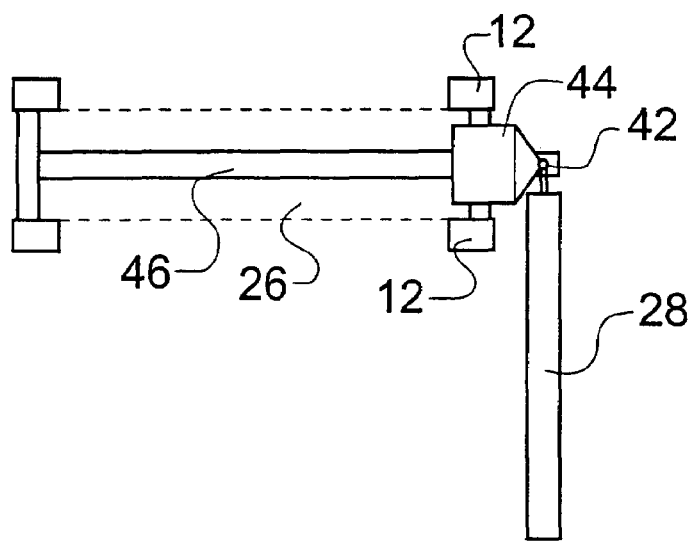

FIG. 2C illustrates a second deployed position of the display 28, in which the display 28 has been pivoted with respect to its position in the first deployed position about a substantially vertical axis about the hinges 42 on the carriage 44, the hinges forming a pivot mechanism. Thus, once the display 28 has been slid into the first deployed position externally of the slot 26, it may be swung into a position extending to the side of the rack 10. A display surface, or screen, 32 is then visible from the front of the rack, this position defining an operative deployed position.

Figure 2D:
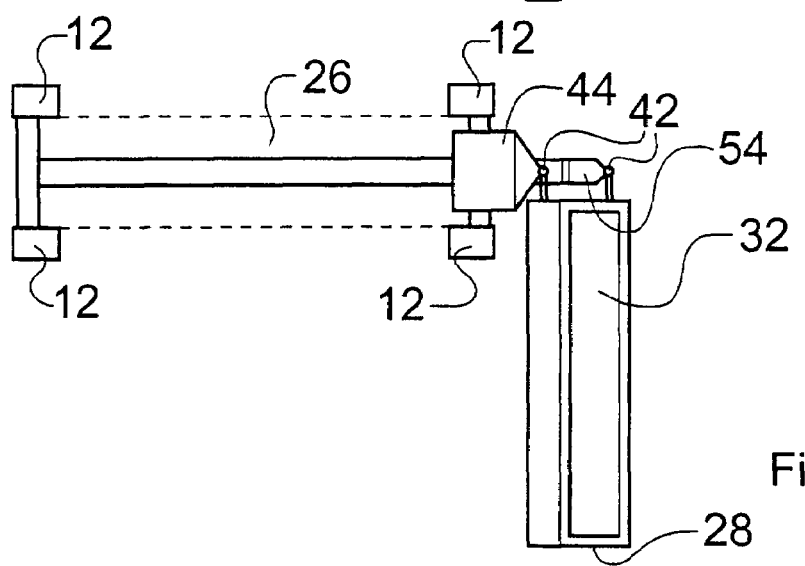

FIG. 2D illustrates a further adjustment of the display, whereby the carriage 26 enables the display 28 to be tilted, to facilitate reading of the display surface 32.

Figure 2E:
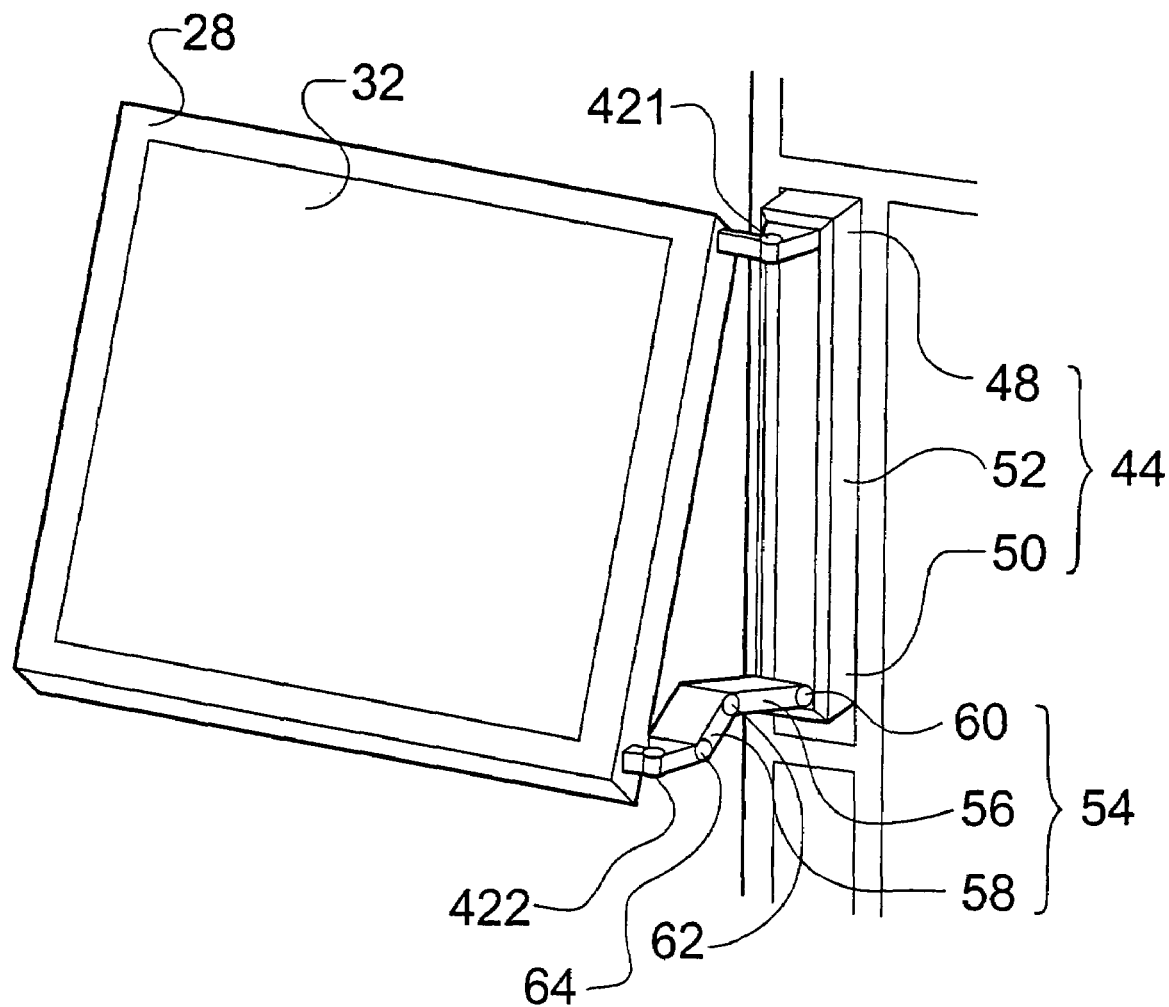

FIG. 2E illustrates, in more detail, one possible embodiment of a support mechanism that facilitates the tilting of the display as represented in FIG. 2D. In the arrangement shown in FIG. 2E, the carriage 44 includes an upper portion 48, a lower portion 50, and an intermediate portion 52 connecting the upper and lower portions. At the upper portion 48 of the carriage 44, a first pivot 421 is arranged to have a further degree of freedom allowing the angle of the display to be moved about a horizontal axis. This is achieved in any conventional manner, for example by providing the hinge with tapered engaging surfaces, or through the use of a universal joint, or by means of a compound hinge. At the lower portion 50 of the carriage 44, an extension mechanism 54 includes a first bar 56, and a second bar 58. The first bar 56 is connected by a first extension hinge 60 to the bottom portion 50 of the carriage 44 and by a second extension hinge 62 to the second bar 58. The second bar 58 is also connected via a third extension hinge 64 to a second pivot 421 connected to the bottom of the display 28. When the display is in the storage position and the first and second deployed positions as illustrated in FIGS. 2A, 2B and 2C, respectively, the bars 56 and 58 are substantially vertical and in contact and the display is retained substantially parallel to the centre portion 52 of the carriage 44. When the display is in the second deployed position illustrated in FIG. 2C and it is desired to adjust the angle of the display 28, the bars are pivoted apart, for example to a position as shown in FIG. 2E, to achieve a desired angle of the display with respect to the vertical. By configuring one or more of the hinges 60, 62 and 64 as a friction hinge, the display 28 can be held in any desired angle with respect to the vertical, subject to the maximum possible extension when the bars 56 and 58 are substantially horizontal. As a possible alternative, a ratchet mechanism could be provided so that the bars 56 and 58 can be held locked in a desired orientation with respect to the vertical. It can be seen therefore, that the display is then pivotable about two axes, one substantially vertical, for the movement between FIGS. 2B and 2C, and one substantially horizontal, for the movement between FIGS. 2C and 2D.

In the above description, the display 28 is arranged at the left-hand side of the rack. It will be appreciated, however, that the display 28 could, alternatively, be arranged at the right-hand side of the rack (as viewed from the front) and could be deployed to the right-hand side of the rack. Indeed, if the placement of the display in front of part of the rack is acceptable, the slot 26 and the display 28 could be located at any appropriate position within the frontal area of the equipment rack.

In the description above, the use of a sliding support arrangement for the display has been described. FIGS. 3A-3D illustrate an example of an alternative, pivotal support arrangement. If a pivotal arrangement is used, and the display 28 is non-circular, then it will be necessary for the slot 26 to be taller than that required exactly for the dimensions of the display 28 to allow for the pivoting movement of the display. FIGS. 3A-3D show a front view, that is a view from the front of the rack 10.

FIG. 3A is a front view (as viewed from the front of the rack), showing the display 28 in a storage position within the slot 26. It will be noted that the slot 26 is taller than the visible dimension of the display 28, which in this embodiment forms an upper surface 66 of the display 28. The display 28 is supported at the top 74 of the slot 26 by means of a universal joint 76, which enables the display 28 to be pivoted from within the slot 26 to a position as shown in FIG. 4B and as represented by the arrow 78.

In a first deployed position illustrated in FIG. 3B, after swiveling of the display about the universal joint 76, and represented by the arrow 78, the upper surface 66 is now at the top of the display 28. A first side 68 of the display 28 facing towards the slot 26 and a second side 70 of the display 28 facing away from the slot 26. A lower surface 72 of the display 28 is at the bottom of the display as shown in FIG. 3B. In this example the display screen 32 is to the right as seen in FIG. 3B.

FIG. 3C shows a further operation in the deployed position, whereby the display 20 is swung to the left-hand side about the universal joint 76, as represented by the arrow 80, so that this may be viewed from the front by the user.

FIG. 3D shows a further operation showing the pivoting of the display 28 with respect to the vertical about the universal joint 76, as represented by the arrow 81, to a position for facilitating reading and operation of the display.

As illustrated in FIGS. 3A-3D, the universal joint is located at the upper portion of the slot 26. However, as an alternative, the universal joint could be provided at the lower portion 75 of the slot 26.

In the above Figures, the display has been shown as a panel, for example a flat panel display unit such as a LCD. As can be seen in the Figures, the width and height of the display panel is greater than its thickness. This is advantageous regarding the storage of the display within the rack and also the deployment thereof. In the storage position the display is preferably arranged substantially vertically and also substantially perpendicularly to the front of the rack (i.e. substantially parallel to the sides of the rack). In this orientation, the stored display has a minimum impact on the vertical cooling paths through the rack and on the frontal area of the rack available for other equipment components. If there is an area within the rack where cooling is not an issue, the display could be stored substantially horizontally, rather than substantially vertically. Where an LCD screen is used, this could be of a standard display size, for example with a diagonal across the visible area of, say 33-38 cm (13-15 inches).

The display is preferably touch sensitive. This can be achieved in any conventional manner, for example through the use of a touch sensitive overlay for the display screen surface. By providing a display with a touch sensitive screen area, the resulting touch sensitive screen can be used as an interactive input device for inputting information into the processor 30, as will be described later.

FIGS. 4A-4C illustrates an alternative form of display. In the example shown in FIGS. 4A-4C the display is in fact configured as a series of sheets of display material (for example on plasticised card) which are connected to the mount. FIG. 4A shows a mount 82 formed as a clamshell hinged at a hinge portion 84. FIG. 4B illustrates the opening of the clamshell mount 82 to provide an upper portion 86 and a lower portion 88 connected by the hinge portion 84.

FIG. 4C illustrates the full deployed position of the display mount 82 supported in this instance by a universal joint 76 at the lower portion of the slot 26. The lower portion 88 of the clamshell display mount 82 provides a table (or substantially horizontal portion) and the upper portion 86 of the clamshell display mount 82 forms a backrest (or substantially vertical portion). Supported within the display mount 82 are a plurality of sheets 90 of display material (for example plasticised card, sheets of plastic, sheets of card, sheets of paper, as appropriate) supported by rings 92 adjacent the hinge portion 84 of the clamshell display mount 82. In use, the user can flick through the individual sheets 90 of the display material to obtain the appropriate display of maintenance information needed to carry out a particular maintenance function. Clearly, in such a case, this form of display is not connected to a maintenance processor.

FIGS. 5A-5C illustrate a display configured as a clamshell type portable computer 94, often known as a laptop computer, contained within a clamshell display mount 96. The display mount 96 is hinged at a lower portion 98 and comprises first and second portions 100 and 102, as shown in FIGS. 5A and 5B.

FIG. 5C illustrates the deployed position of the clamshell display mount 96 showing the portable computer 94 on the display mount 96. The display mount 96 is connected, in the present instance, by a universal joint 76 at the bottom of the slot 26. The portable computer 94 is connected by means of cables 104 to one or more equipment components within the rack 10. The computer 94 includes a LCD display 106 and a keyboard 108, in a conventional manner.

Through the use of a portable computer of this type, an inexpensive implementation of display apparatus can be provided, which provide significant advantages over the use of sheet material as represented in FIGS. 4A-4C. The portable computer can be provided with its own power supply, and/or back-up batteries to enable the continued operation thereof in the event the failure or removal of the power supply to remaining equipment in the equipment rack.

The portable computer 94 can be programmed with appropriate diagnostic and maintenance programs and can be arranged to provide to a service engineer via the display 28 a sequence of tasks necessary in order to perform maintenance of the equipment contained within the rack 10. Indeed, by connecting the portable computer 94 to the diagnostic elements of the equipment within the rack, the portable computer 94 can be responsive to information received via the cables 104 about failed or faulty equipment components to control the display of the maintenance tasks to the service engineer. It can be operable to assist in the diagnosis and reporting of faults, and, as a consequence thereof, to navigate the service engineer through an appropriate sequence of operations for repairing or replacing faulty equipment.

Figure 6:
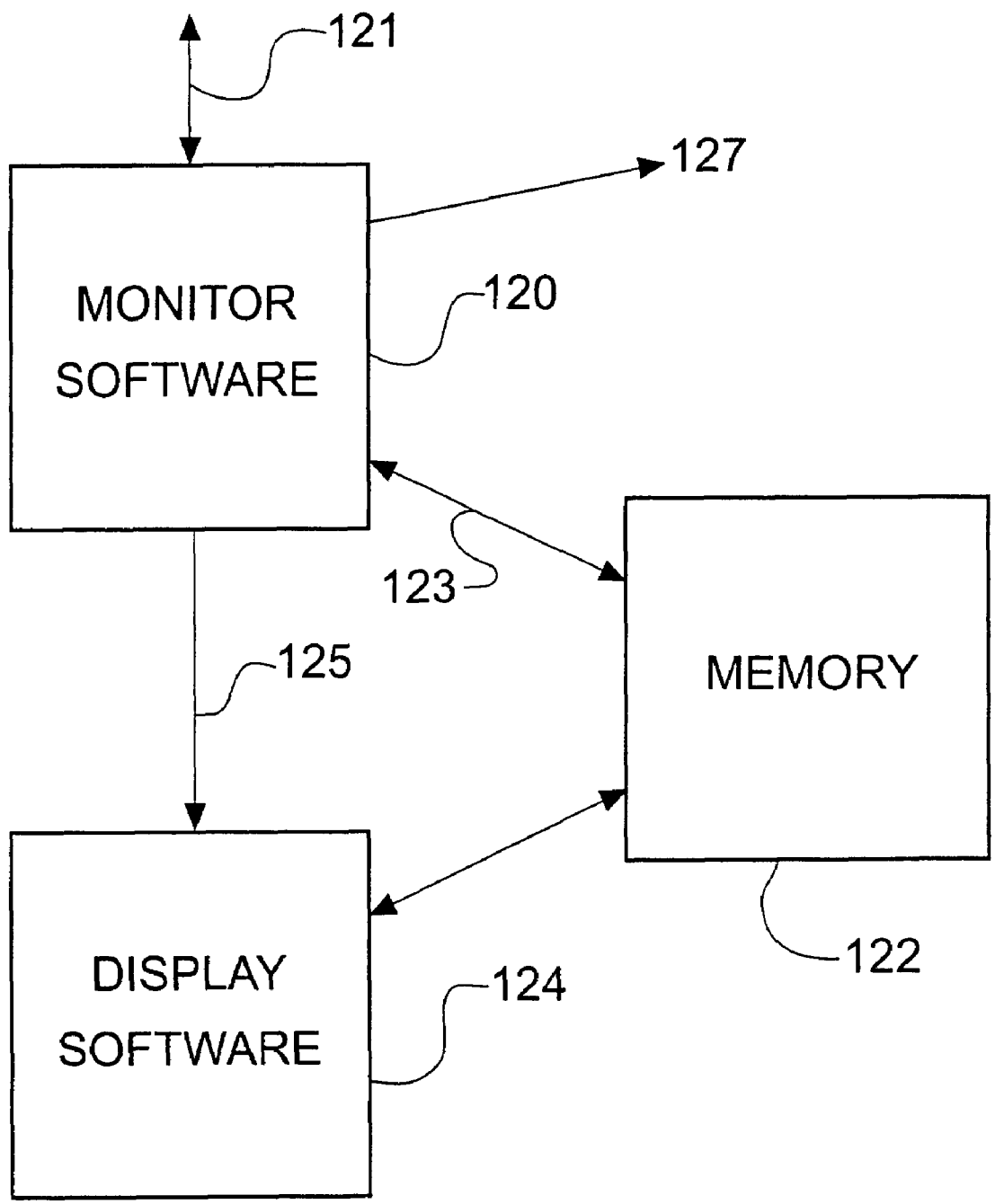
FIG. 6 is a diagram illustrating software components and memory.

Thus, program code controls the processor to cause the display of an interactive sequence of instructions to service personnel for maintaining the electronic rack equipment, with the program code responsive to the status information for controlling the interactive sequence of instructions. FIG. 6 illustrates software components 120 and 124 and memory 122 for such an embodiment.

Where a portable computer 94 is used as the display apparatus, the maintenance computer 30 shown in FIG. 1 can be dispensed with, if desired. As an alternative to the use of a portable computer 94, the combination of a display 28, with a touch sensitive screen and/or other input device(s), and the maintenance computer 30 can provide the same functions as described above with reference to the portable computer of FIG. 5C. Thus, the maintenance computer 30 can be provided with its own power supply, and/or back-up batteries to enable the continued operation thereof in the event the failure or removal of the power supply to remaining equipment in the equipment rack. Also, it can be programmed with appropriate diagnostic and maintenance programs and can be arranged to provide to a service engineer via the display 28 instructions for a sequence of tasks necessary in order to perform maintenance of the equipment contained within the rack 10. The maintenance computer 30 can be connected to diagnostic elements of the equipment within the rack and be responsive to information received about failed or faulty equipment components to control the display of the maintenance tasks to the service engineer. It can be operable to assist in the diagnosis and reporting of faults, and, as a consequence thereof, to navigate the service engineer through an appropriate sequence of operations for repairing or replacing faulty equipment.

Figure 7:
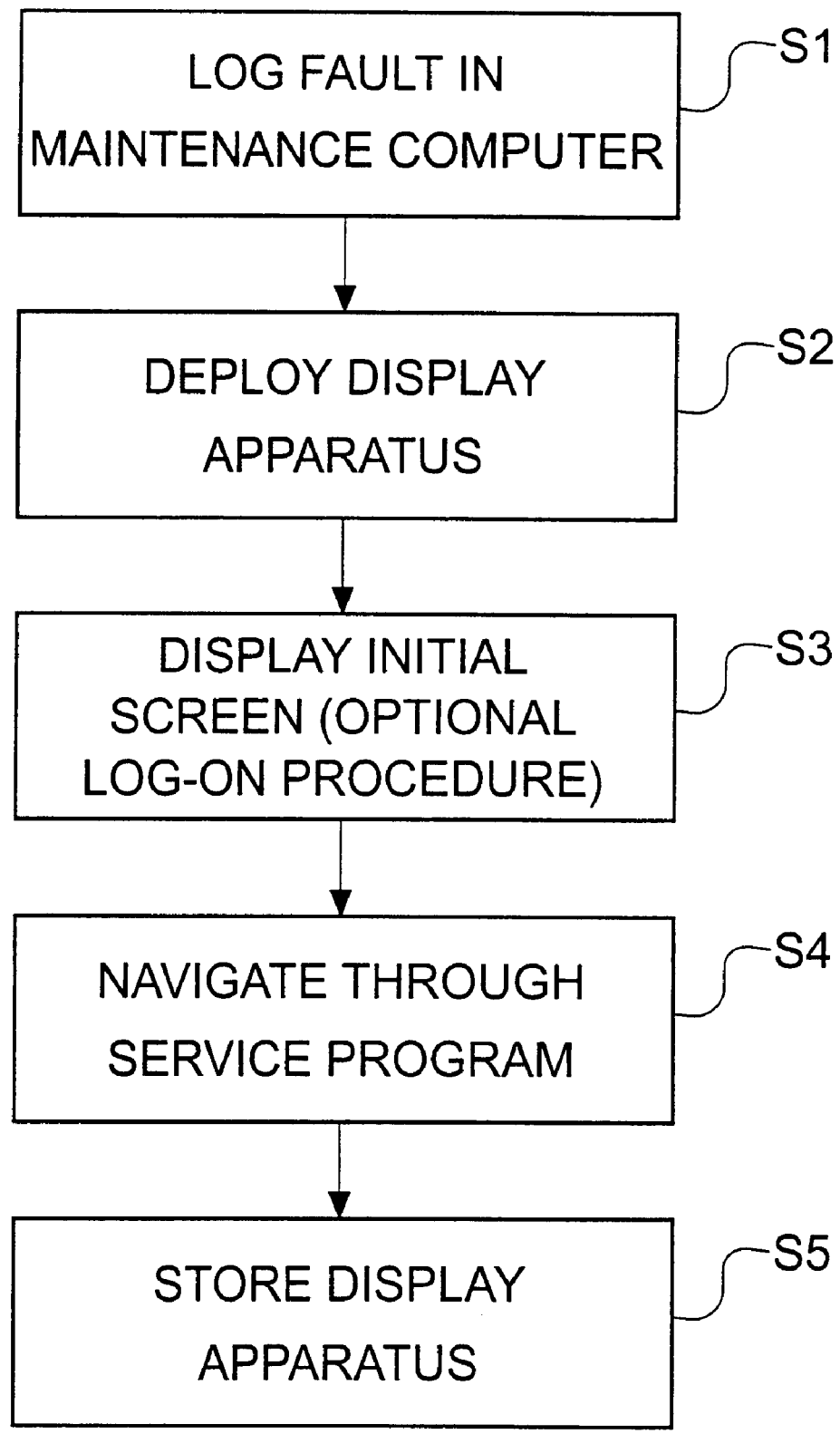
FIG. 7 is a flow diagram illustrating a method of use of a display as shown in FIG. 3.

FIG. 7 is a flow diagram illustrating a series of steps illustrating the use of interactive display apparatus using a touch sensitive screen and maintenance computer connected to the equipment within the rack for the sensing and reporting of faults and the guiding of the service engineer through maintenance tasks to repair the faulty equipment.

In step S1, the maintenance computer (which, as examples only, can be integrated in the rack as in FIG. 1, or integrated with the display as in FIG. 5) is responsive to a fault of component in the rack. The remote reporting of the rack could be a function of the maintenance computer or of another component of the rack, and does not form part of the present invention.

In step S2, a service engineer, who will have been made aware of the fault by the aforementioned remote reporting procedure, deploys the display from its storage position within the rack to a deployed operative position as described above with respect to the example constructions in FIGS. 2 and 3.

In step S3, the maintenance computer displays an initial screen to the service engineer, which can include, for example, a secure log-on procedure to identify the service engineer as an authorised person to carry out maintenance tasks. If a log-on procedure is employed, the successful completion of this is required before proceeding to step S5

In step S4, an interactive maintenance process occurs that involves the display of screens giving instructions to the service engineer, the carrying out of those instructions by the service engineer and the service engineer making appropriate selections to proceed though the series of tasks using the touch sensitive screen to select appropriate options. In this process, the processor can be operative to control the navigation through the screen displays and the tasks in a passive way in response to the selections of displayed buttons, etc., by the service engineer. Alternatively, the processor can be programmed to control the navigation through the screen displays and the tasks in an active way dependent upon information received from the service engineer or automatically from the equipment as to the configuration of the equipment components and/or the models and/or versions of those components and/or faults in the equipment components, for example.

In step S5, following completions of the maintenance tasks, the service engineer returns the display to its storage position.

It will be appreciated that although particular embodiments of the invention have been described, many modifications/additions and/or substitutions may be made within the spirit and scope of the present invention. Accordingly, the particular example described is intended to be illustrative only, and not limitative.

What is claimed is:

1. Rack mountable display apparatus configured to be used with an electronic equipment rack, said apparatus comprising a display and a support mechanism configured to support the display, the display being moveable between a substantially vertical orientation extending back into the rack when in a retracted storage position within the electronic equipment rack and a deployed position external to the electronic equipment rack, wherein the support mechanism comprises a slide, the display being slideable between the storage position with the display stored within the electronic equipment rack and the deployed position with the display deployed externally to the electronic equipment rack.

2. The rack mountable display apparatus of claim 1, wherein the support mechanism comprises an orientation mechanism operable to orient the display in the deployed position to facilitate reading of the display.

3. The rack mountable display apparatus of claim 2, wherein the orientation mechanism provides rotation about at least one axis.

4. The rack mountable display apparatus of claim 2, wherein the orientation mechanism provides rotation about two axes.

5. The rack mountable display apparatus of claim 1, wherein the thickness of the display is less than the height and width of the display.

6. The rack mountable display apparatus of claim 1, wherein the display comprises a display screen.

7. The rack mountable display apparatus of claim 6, wherein the display screen is a flat panel display screen.

8. The rack mountable display apparatus of claim 1, wherein the display comprises a touch sensitive screen.

9. The rack mountable display apparatus of claim 1, wherein the display is connected to a processor.

10. The rack mountable display apparatus of claim 9, wherein the processor is retained within the electronic equipment rack when the display is deployed.

11. The rack mountable display apparatus of claim 9, wherein the processor is deployed with the display.

12. The rack mountable display apparatus of claim 11, wherein the display and the processor are part of a portable computer.

13. The rack mountable display apparatus of claim 9, further comprising a keyboard connected to the processor.

14. The rack mountable display apparatus of claim 9, comprising program code for controlling the processor to cause the display to display an interactive sequence of instructions to service personnel for maintaining the electronic rack equipment.

15. A method of providing maintenance information to personnel for maintaining electronic equipment mounted in a rack, the method comprising providing a support mechanism for a display, the display being moveable between a substantially vertical orientation extending back into the rack when in a retracted storage position within the rack and a deployed position external to the rack and providing maintenance information on a plurality of sheets of sheet material to the support personnel when the display is located in the deployed position.

16. Rack mountable display apparatus configured to be used with an electronic equipment rack, said apparatus comprising a display and a support mechanism configured to support the display, the display being moveable between a storage position within the electronic equipment rack and a deployed position external to the electronic equipment rack;
wherein the support mechanism comprises a slide, the display being slideable between the storage position with the display stored within the electronic equipment rack and the deployed position with the display deployed externally to the electronic equipment rack;
wherein the support mechanism comprises an orientation mechanism operable to orient the display in the deployed position to facilitate reading of the display;
wherein the orientation mechanism provides rotation about two axes.

17. The rack mountable display apparatus of claim 16, wherein the thickness of the display is less than the height and width of the display.

18. The apparatus of claim 16, wherein the display comprises a plurality of sheets of display material, and wherein the support mechanism comprises a carrier for the plurality of sheets of display material.

19. The rack mountable display apparatus of claim 16, wherein the display comprises a flat panel display screen.

20. The rack mountable display apparatus of claim 16, wherein the display is connected to a processor.

21. Rack mountable display apparatus configured to be used with an electronic equipment rack, said apparatus comprising a display and a support mechanism configured to support the display, the display being moveable between a storage position within the electronic equipment rack and a deployed position external to the electronic equipment rack;
wherein the support mechanism comprises a pivot mechanism, the display being pivotable between the storage position with the display stored within the electronic equipment rack and the deployed position with the display deployed externally to the electronic equipment rack; and
wherein the pivot mechanism is formed by a universal joint operable to enable pivoting of the display between the storage position with the display stored within the electronic equipment rack and the deployed position with the display deployed externally to the electronic equipment rack and further to enable orientation of the display to a desired orientation to facilitate reading of the display.

22. The rack mountable display apparatus of claim 21, wherein the thickness of the display is less than the height and width of the display.

23. The apparatus of claim 21, wherein the display comprises a plurality of sheets of display material, and wherein the support mechanism comprises a carrier for the plurality of sheets of display material.

24. The rack mountable display apparatus of claim 21, wherein the display comprises a flat panel display screen.

25. The rack mountable display apparatus of claim 21, wherein the display is connected to a processor.

26. The apparatus of claim 1, wherein the display comprises a plurality of sheets of display material.

27. The apparatus of claim 1, wherein the support mechanism comprises a carrier for sheet display material.

28. A method according to claim 15, comprising providing maintenance information on a plurality of sheets of sheet material.

29. Rack mountable display apparatus configured to be used with an electronic equipment rack, said apparatus comprising a display and a support mechanism configured to support the display, the display being moveable between a substantially vertical orientation extending back into the rack when in a retracted storage position within the electronic equipment rack and a deployed position external to the electronic equipment rack, wherein the support mechanism comprises a pivot mechanism, the display being pivotable between the storage position with the display stored within the electronic equipment rack and the deployed position with the display deployed externally to the electronic equipment rack, and wherein the pivot mechanism is formed by a universal joint operable to enable pivoting of the display between the storage position with the display stored within the electronic equipment rack and the deployed position with the display deployed externally to the electronic equipment rack and further to enable orientation of the display to a desired orientation to facilitate reading of the display.

30. The rack mountable display apparatus of claim 29, wherein the display is a flat panel display screen.

31. The rack mountable display apparatus of claim 29, wherein the display is connected to a processor.

32. The rack mountable display apparatus of claim 31, further comprising a keyboard connected to the processor.

* * * * *